(12) United States Patent
Kim et al.

(10) Patent No.: US 9,842,864 B2
(45) Date of Patent: Dec. 12, 2017

(54) THIN FILM TRANSISTOR SUBSTRATE AND DISPLAY APPARATUS USING THE SAME

(71) Applicant: LG DISPLAY CO., LTD., Seoul (KR)

(72) Inventors: Hyun Ho Kim, Seoul (KR); Woo Joon Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 149 days.

(21) Appl. No.: 14/871,070

(22) Filed: Sep. 30, 2015

(65) Prior Publication Data

US 2016/0093647 A1    Mar. 31, 2016

(30) Foreign Application Priority Data

Sep. 30, 2014 (KR) .................. 10-2014-0131762

(51) Int. Cl.

| | |
|---|---|
| *H01L 27/12* | (2006.01) |
| *H01L 27/32* | (2006.01) |
| *G02F 1/1362* | (2006.01) |
| *H01L 29/417* | (2006.01) |
| *H01L 29/66* | (2006.01) |

(Continued)

(52) U.S. Cl.
CPC .... *H01L 27/1255* (2013.01); *G02F 1/136213* (2013.01); *G02F 1/136227* (2013.01); *H01L 27/3248* (2013.01); *H01L 27/3272* (2013.01); *H01L 29/41733* (2013.01); *H01L 29/66757* (2013.01); *H01L 29/78621* (2013.01); *H01L 29/78633* (2013.01); *H01L 29/78645* (2013.01); *G02F 2001/133357* (2013.01)

(58) Field of Classification Search
CPC ..... H01L 27/12; H01L 27/32; H01L 27/3248; H01L 27/1255; H01L 27/3272; H01L 29/66757; H01L 29/78621
See application file for complete search history.

(56) References Cited

U.S. PATENT DOCUMENTS 6,130,455 A    10/2000 Yoshinouchi et al.
9,601,527 B2 *  3/2017 Kang ................... H01L 27/1259
(Continued)

FOREIGN PATENT DOCUMENTS

| JP | 2007-220817 A | 8/2007 |
|---|---|---|
| KR | 10-2006-0075586 A | 7/2006 |
| KR | 10-2013-0110490 A | 10/2013 |

*Primary Examiner* — Phuc Dang
(74) *Attorney, Agent, or Firm* — Dentons US LLP (57) ABSTRACT

A thin film transistor (TFT) substrate is disclosed. The TFT substrate includes a substrate, a blocking layer, a source electrode, and a drain electrode on a same layer over the substrate, an active layer overlapping the blocking layer, the source electrode, and the drain electrode, a gate insulation layer over the active layer, a first gate electrode over the gate insulation layer, an interlayer dielectric over the first gate electrode, a first connection electrode over the interlayer dielectric and connected to the active layer and the source electrode through a first contact hole, a second connection electrode over the interlayer dielectric and connected to the active layer and the drain electrode through a second contact hole, a planarization layer over the first connection electrode and the second connection electrode, and a pixel electrode over the planarization layer and connected to the second connection electrode through a third contact hole.

15 Claims, 9 Drawing Sheets

(51) Int. Cl.
  *H01L 29/786*    (2006.01)
  *G02F 1/1333*    (2006.01)

(56) References Cited

U.S. PATENT DOCUMENTS

| | | | | |
|---|---|---|---|---|
| 2005/0189535 A1* | 9/2005 | Hsueh | ............... | H01L 51/5284 |
| | | | | 257/40 |
| 2007/0181881 A1* | 8/2007 | Koh | ............... | G09G 3/3225 |
| | | | | 257/67 |
| 2007/0247556 A1* | 10/2007 | Jang | ............... | G02F 1/136209 |
| | | | | 349/38 |
| 2009/0166633 A1* | 7/2009 | Lee | ............... | G02F 1/136209 |
| | | | | 257/59 |
| 2010/0044685 A1* | 2/2010 | Kim | ............... | H01L 27/3272 |
| | | | | 257/40 |
| 2013/0256668 A1 | 10/2013 | Oh et al. | | |
| 2016/0141425 A1* | 5/2016 | Sun | ............... | H01L 27/124 |
| | | | | 257/72 |

* cited by examiner

THIN FILM TRANSISTOR SUBSTRATE AND DISPLAY APPARATUS USING THE SAME

CROSS-REFERENCE TO RELATED APPLICATIONS

This application claims the benefit of the Korean Patent Application No. 10-2014-0131762 filed on Sep. 30, 2014, which is hereby incorporated by reference for all purposes as if fully set forth herein.

BACKGROUND OF THE INVENTION

Field of the Invention

The present invention relates to a thin film transistor (TFT) substrate. More particularly, the present invention relates to a TFT substrate applied to a flexible display apparatus.

Discussion of the Related Art

Thin film transistors (TFTs) are being widely used as switching devices of display apparatuses such as liquid crystal display (LCD) apparatuses, organic light emitting display apparatuses, etc. Therefore, a TFT substrate where a plurality of TFTs are formed is a fundamental element of a display apparatus.

Research on flexible display apparatuses is being actively done. Since it is required for the flexible display apparatuses to be bent or wound, instead of glass, a polymer material such as polyimide (PI) or the like is used as a material of a substrate configuring a base of a TFT substrate.

Hereinafter, a related art TFT substrate which uses a polymer material, such as PI or the like, as a material of a substrate will be described.

Figure 1:
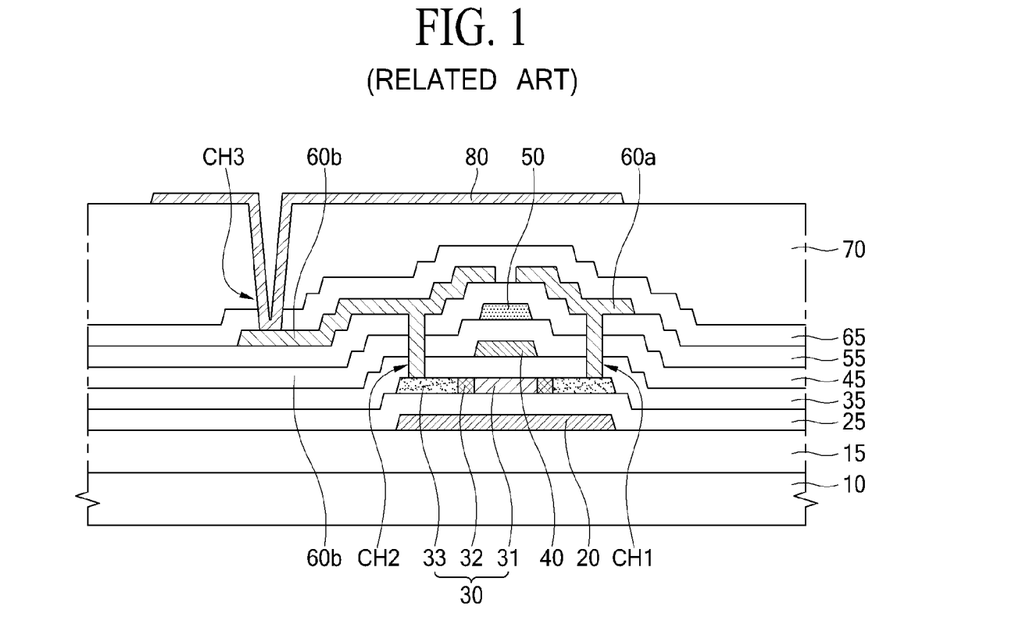
FIG. 1 is a schematic cross-sectional view of a related art TFT substrate.

FIG. 1 is a schematic cross-sectional view of a related art TFT substrate.

As seen in FIG. 1, the related art TFT substrate includes a substrate 10, a first buffer layer 15, a blocking layer 20, a second buffer layer 25, an active layer 30, a first gate insulation layer 35, a first gate electrode 40, a second gate insulation layer 45, a second gate electrode 50, an interlayer dielectric 55, a source electrode 60a, a drain electrode 60b, a passivation layer 65, a planarization layer 70, and a pixel electrode 80.

The substrate 10, as described above, is formed of a polymer material such as PI or the like.

The first buffer layer 15 is formed on the substrate 10.

The blocking layer 20 is formed on the first buffer layer 15. The blocking layer 20 is formed between the substrate 10 and the active layer 30 and prevents a movement of an electron in a channel area of the active layer 30, from being adversely affected by a component included in the substrate 10.

The second buffer layer 25 is formed on the blocking layer 20.

The active layer 30 is formed on the second buffer layer 25. The active layer 30 includes a channel area 31, a plurality of low-concentration doping areas 32 which are respectively provided at a left side and a right side of the channel area 31, and a plurality of high-concentration doping areas 33 which are respectively provided at a left side of one of the low-concentration doping areas 32 and a right side of the other of the low-concentration doping areas 32.

The first gate insulation layer 35 is formed between the active layer 30 and the first gate electrode 40, and the first gate electrode 40 is formed on the first gate insulation layer 35.

The second gate insulation layer 45 is formed between the first gate electrode 40 and the second gate electrode 50, and the second gate electrode 50 is formed on the second gate insulation layer 45.

The interlayer dielectric 55 is formed on the second gate electrode 50, and the source electrode 60a and the drain electrode 60b are formed on the interlayer dielectric 55. The source electrode 60a is connected to one of the high-concentration doping areas 32 of the active layer 30 through a first contact hole CH1, and the drain electrode 60b is connected to the other of the high-concentration doping areas 32 through a second contact hole CH2.

The passivation layer 65 is formed on the source electrode 60a and the drain electrode 60b, and the planarization layer 70 is formed on the passivation layer 65.

The pixel electrode 80 is formed on the planarization layer 70. The pixel electrode 80 is connected to the drain electrode 60b through a third contact hole CH3.

FIGS. 2A to 2I are diagrams illustrating a process of manufacturing the related art TFT substrate.

Figure 2A:
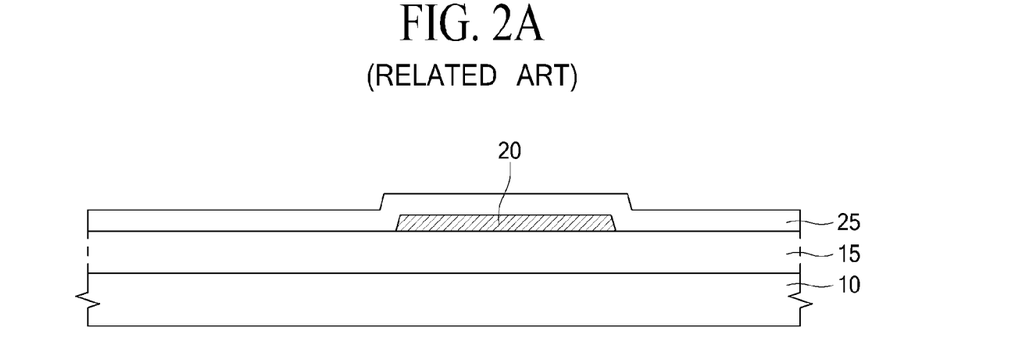
FIGS. 2A to 2I are diagrams illustrating a process of manufacturing the related art TFT substrate.

First, as seen in FIG. 2A, the first buffer layer 15 is formed on the substrate 10, the blocking layer 20 is pattern-formed on the first buffer layer 15, and the second buffer layer 25 is formed on the blocking layer 20.

A first mask process is performed for forming a pattern of the blocking layer 20. In the present specification, a mask process denotes a pattern forming process that includes an exposure process using a mask for obtaining a structure of a certain pattern. Although not shown, the blocking layer 20 is connected to an external signal driver at an outer portion of the substrate 10. To this end, the blocking layer 20 extends to the outer portion of the substrate 10, and a process of forming a contact hole in the second buffer layer 25 is performed for exposing a portion of the blocking layer 20 at the outer portion of the substrate 10. A second mask process is performed for forming the contact hole.

Figure 2B:
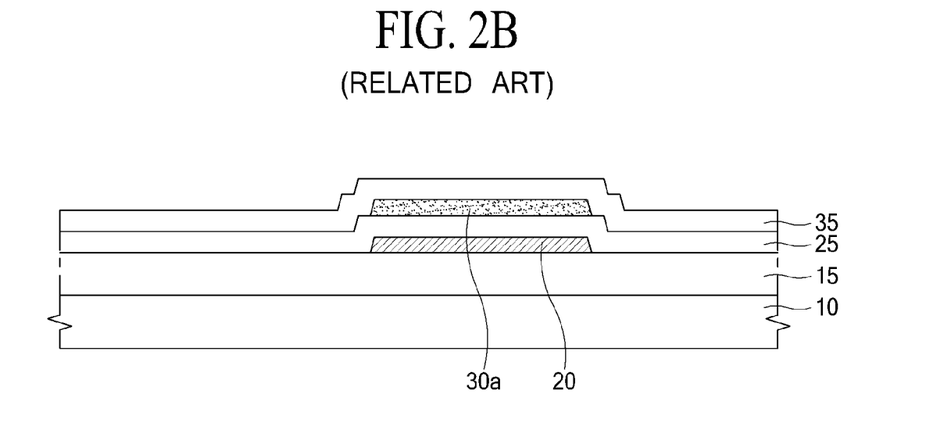

Subsequently, as seen in FIG. 2B, a semiconductor layer 30a for an active layer is pattern-formed on the second buffer layer 25, and the first gate insulation layer 35 is formed on the semiconductor layer 30a for the active layer. A third mask process is performed for pattern-forming the semiconductor layer 30a for the active layer.

Figure 2C:
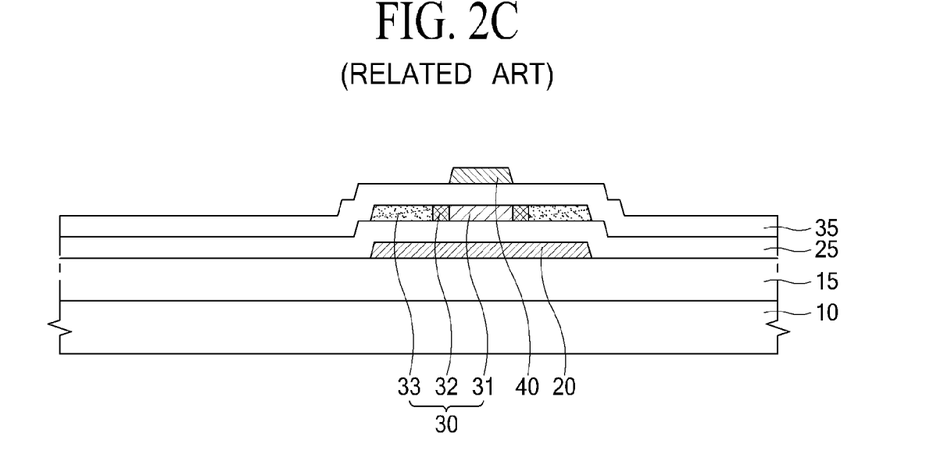

Subsequently, as seen in FIG. 2C, the first gate electrode 40 is pattern-formed on the first gate insulation layer 35. A fourth mask process is performed for pattern-forming the first gate electrode 40.

After the first gate electrode 40 is pattern-formed, a low-concentration dopant is doped on the semiconductor layer 30a for the active layer by using the first gate electrode 40 as a mask. Therefore, an area where the low-concentration dopant is not doped becomes the channel area 31, and the low-concentration doping areas 32 are respectively formed at the left side and right side of the channel area 31.

Subsequently, although not shown, a photoresist pattern is formed on the first gate insulation layer 35, and then, by using the photoresist pattern as a mask, the high-concentration doping areas 33 are respectively formed at the left side of one of the low-concentration doping areas 32 and the right side of the other of the low-concentration doping areas 32. As a result, the active layer 30 which includes the channel area 31, the low-concentration doping areas 32 which are respectively provided at a left side and a right side of the channel area 31, and the high-concentration doping areas 33 which are respectively provided at a left side of one of the low-concentration doping areas 32 and a right side of the other of the low-concentration doping areas 32 are finished.

In this case, a fifth mask process is performed for forming the photoresist pattern for forming each of the high-concentration doping areas 33.

Figure 2D:
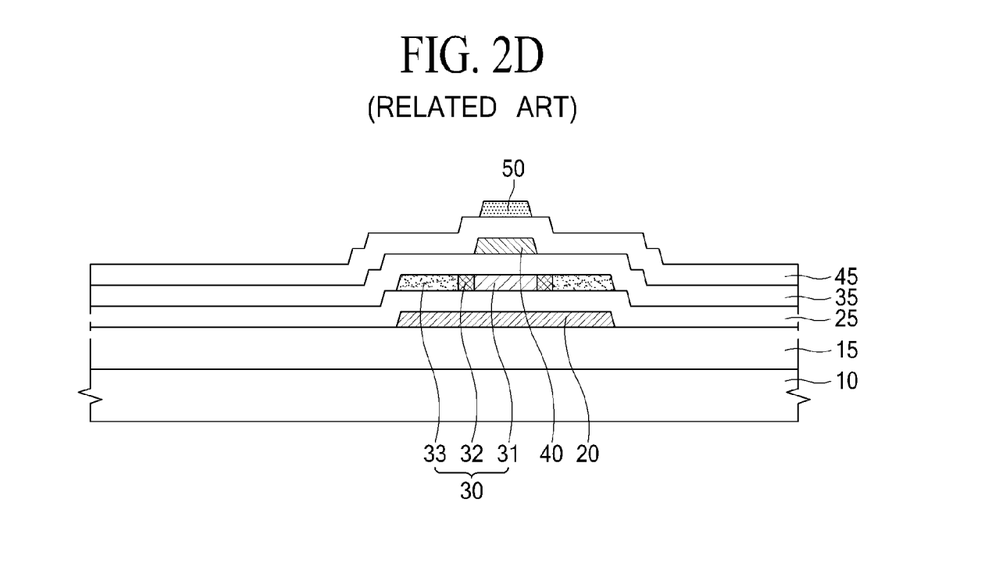

Subsequently, as seen in FIG. 2D, the second gate insulation layer 45 is formed on the first gate electrode 40, and the second gate electrode 50 is pattern-formed on the second gate insulation layer 45. A sixth mask process is performed for pattern-forming the second gate electrode 50.

Figure 2E:
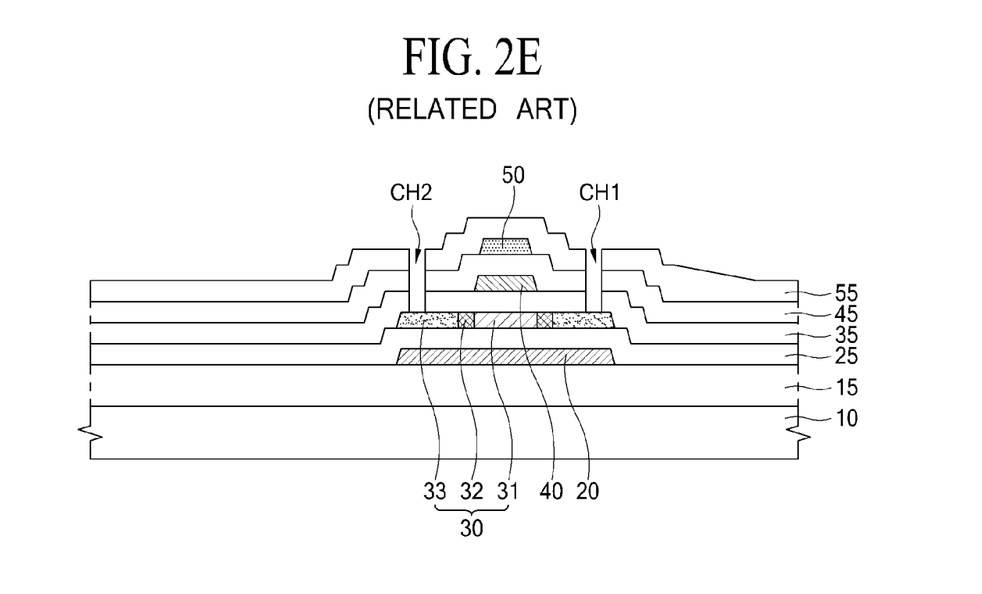

Subsequently, as seen in FIG. 2E, the interlayer dielectric 55 is formed on the second gate electrode 50, and the first contact hole CH1 and the second contact hole CH2 are formed for exposing the high-concentration doping areas 33 of the active layer 30. A seventh mask process is performed for forming the first contact hole CH1 and the second contact hole CH2. In addition, a thermal treatment process for activation is performed before the first contact hole CH1 and the second contact hole CH2 are formed.

Figure 2F:
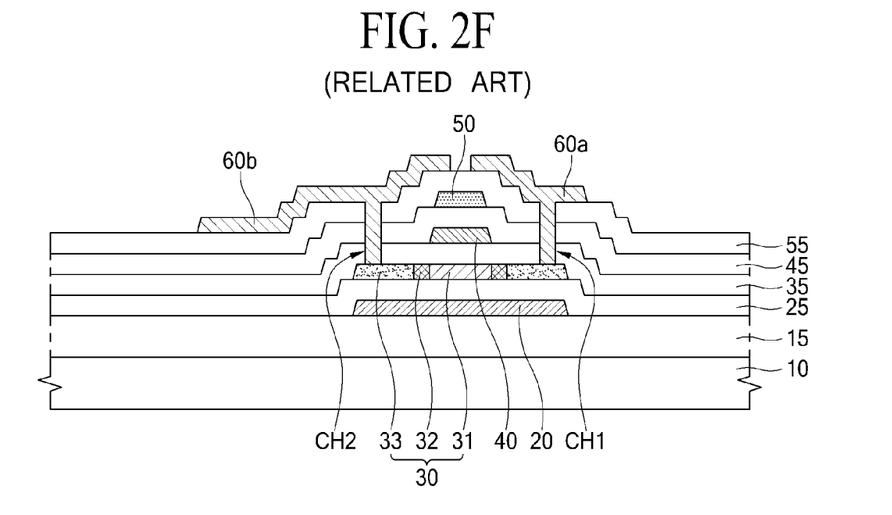

Subsequently, as seen in FIG. 2F, the source electrode 60a and the drain electrode 60b which are respectively connected to the high-concentration doping areas 32 of the active layer 30 through the first and second contact holes CH1 and CH2 are pattern-formed. An eighth mask process is performed for forming the source electrode 60a and the drain electrode 60b.

Figure 2G:
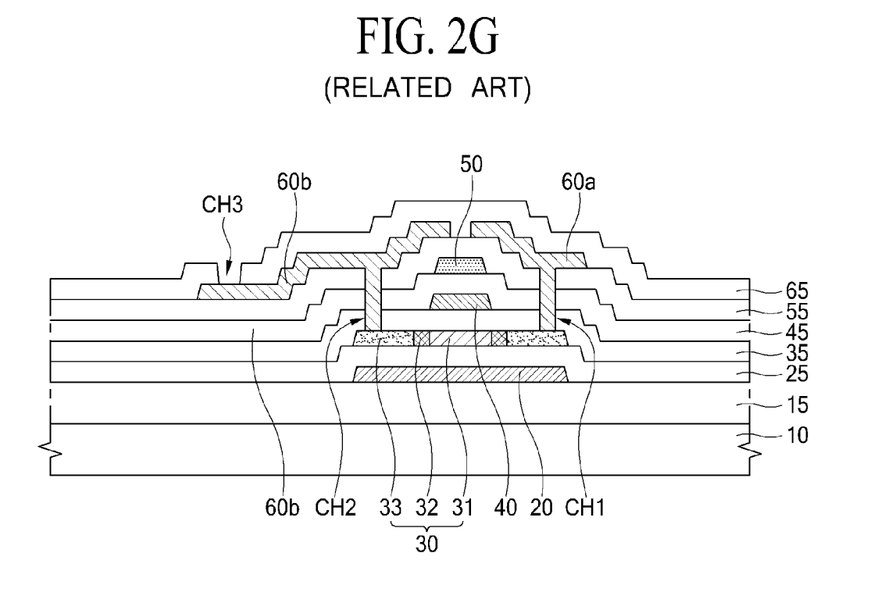

Subsequently, as seen in FIG. 2G, the passivation layer 65 is formed on the source electrode 60a and the drain electrode 60b, and the third contact hole CH3 is formed for exposing the drain electrode 60b. A ninth mask process is performed for forming the third contact hole CH3. A thermal treatment process for hydrogenation is performed before the third contact hole CH3 is formed. By performing the thermal treatment process for hydrogenation, hydrogen (H) included in the passivation layer 65 is diffused to the active layer 30, and thus, the dangling bonds of the active layer 30 are reduced.

Figure 2H:
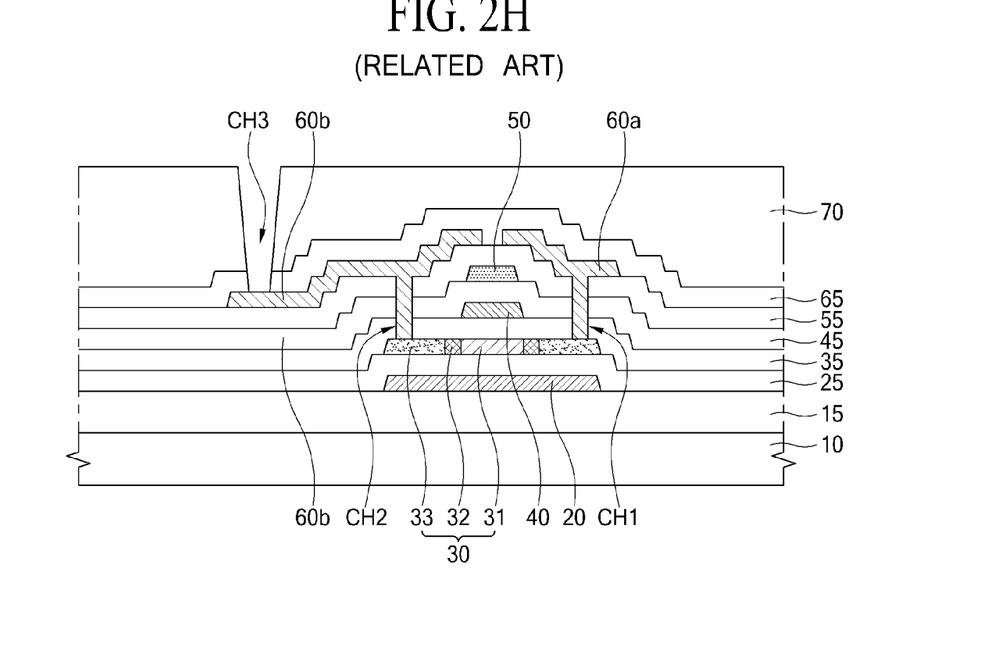

Subsequently, as seen in FIG. 2H, the planarization layer 70 is formed on the passivation layer 65, and then, the third contact hole CH3 is formed for exposing the drain electrode 60b. The third contact hole CH3 is obtained by removing a portion of the planarization layer 70 over the passivation layer 65 and within the opening in the passivation layer 65 formed in the previous process using the ninth mask, to thereby expose again the surface of the drain electrode 60b. Illustratively, the third contact hole CH3 is formed in two separate processes, first forming an opening in the passivation layer 65 (before the planarization layer 70 is formed) and second, in a subsequent process, after having formed the planarization layer 70, removing material of the planarization layer 70 over and in the opening in the passivation layer 65. A tenth mask process is performed for obtaining the third contact hole CH3 by removing a portion of the planarization layer 70.

Figure 2I:
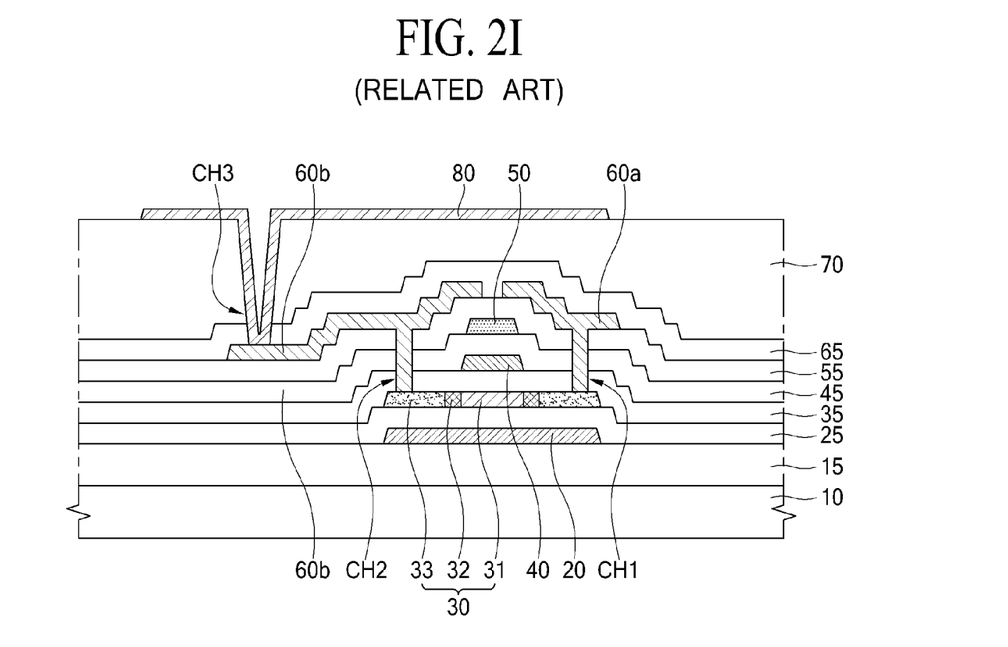

Subsequently, as seen in FIG. 2I, the pixel electrode 80 which is connected to the drain electrode 60b through the third contact hole CH3 is pattern-formed. An eleventh mask process is performed for pattern-forming the pixel electrode 80.

As described above, in the related art TFT substrate, since a total eleven-time mask process is needed, a process is very complicated.

SUMMARY OF THE INVENTION

Accordingly, the present invention is directed to provide a TFT substrate, a method of manufacturing the same, and a display apparatus using the same that substantially obviate one or more problems due to limitations and disadvantages of the related art.

An aspect of the present invention is directed to provide a TFT substrate, a method of manufacturing the same, and a display apparatus using the same, in which the number of mask processes is reduced.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In various embodiments, a thin film transistor (TFT) substrate is provided. The TFT substrate may include a substrate, a blocking layer, a source electrode, and a drain electrode disposed on a same layer over the substrate, an active layer disposed to overlap the blocking layer, the source electrode, and the drain electrode, a gate insulation layer disposed over the active layer, a first gate electrode disposed over the gate insulation layer, an interlayer dielectric disposed over the first gate electrode, a first connection electrode disposed over the interlayer dielectric and connected to the active layer and the source electrode through a first contact hole, a second connection electrode disposed over the interlayer dielectric and connected to the active layer and the drain electrode through a second contact hole, a planarization layer disposed over the first connection electrode and the second connection electrode, and a pixel electrode disposed over the planarization layer and connected to the second connection electrode through a third contact hole.

The thin film transistor substrate may further include a thin film transistor area and a capacitor area, and at least one capacitor formed in the capacitor area. The blocking layer, the source electrode, and the drain electrode may be formed in the thin film transistor area.

The capacitor may include a first capacitor electrode and a second capacitor electrode. The first capacitor electrode, the blocking layer, the source electrode, and the drain electrode may be disposed on the same layer.

The thin film transistor substrate may further include a first buffer layer disposed over the substrate, and a second buffer layer disposed over the first buffer layer. The source electrode and the drain electrode may be interposed between the first buffer layer and the second buffer layer.

Furthermore, the source electrode and the drain electrode may be formed of a material which differs from the material of the blocking layer and, if appropriate the first capacitor electrode, respectively.

In various embodiments, the capacitor may include a first capacitor electrode and a second capacitor electrode. The second capacitor electrode and the first gate electrode may be formed on the same layer.

The second capacitor electrode and the first gate electrode may be formed of the same material.

The first capacitor electrode and the second capacitor electrode may be formed to laterally overlap each other.

The thin film transistor substrate may further include a second gate electrode. A second gate electrode, the first connection electrode, and the second connection electrode may be formed on the same layer.

Furthermore, the second gate electrode, the first connection electrode, and the second connection electrode may be formed on the interlayer dielectric.

Moreover, the first connection electrode and the second connection electrode each may extend through the interlayer dielectric, the gate insulation layer, and the active layer and may electrically connect the source electrode and the drain electrode, respectively.

The first contact hole and the second contact hole each may be in direct contact with the active layer.

The active layer may include a first region having two first partial regions, the first partial regions having a first doping concentration, a second region having two second partial regions, the second partial regions having a second doping concentration being smaller than the first doping concentration, and a channel region. One second partial region may be arranged adjacent to the channel region on one side of the channel region, and another second partial region is arranged adjacent to the channel region on an opposite side of the channel region. One first partial region may be arranged adjacent to one second partial region on one side, and another first partial region may be arranged adjacent to the other second partial region. The first connection electrode may be electrically coupled with the one first partial region and with the source electrode. The second connection electrode may be electrically coupled with the other first partial region and with the drain electrode.

One first partial region may laterally overlap the source electrode. The other first partial region may laterally overlap the drain electrode. The channel region may laterally overlap the blocking layer.

In various embodiments, a light emitting display apparatus is provided. The light emitting display apparatus may include a thin film transistor substrate as previously described or as will be described further below, and a further substrate arranged opposite the thin film transistor substrate.

The light emitting display apparatus may further include a liquid crystal layer formed between the thin film transistor substrate and the further substrate.

In various embodiments, a light emitting display apparatus is provided. The light emitting display apparatus may include a thin film transistor substrate as previously described or as will be described further below, and an organic layer structure configured to emit light. The organic layer structure may be disposed over the pixel electrode.

The light emitting display apparatus may further include a bank disposed between the thin film transistor substrate and the organic layer structure.

The light emitting display apparatus may further include a further electrode disposed over the organic layer structure.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

Figure 3:
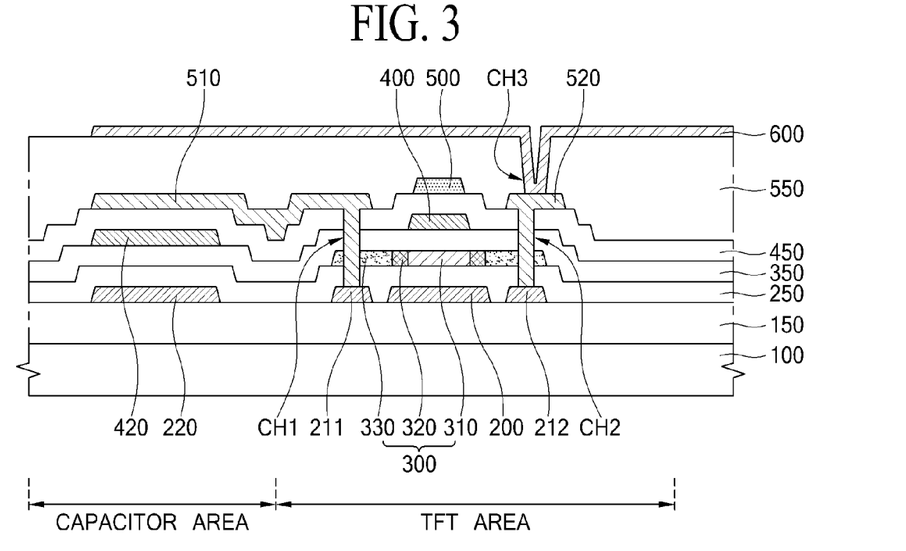
FIG. 3 is a schematic cross-sectional view of a TFT substrate according to an embodiment of the present invention.

FIG. 3 is a schematic cross-sectional view of a TFT substrate according to an embodiment of the present invention.

As seen in FIG. 3, the TFT substrate according to an embodiment of the present invention may include a TFT area and a capacitor area. The TFT substrate according to an embodiment of the present invention may include a substrate 100, a first buffer layer 150, a blocking layer 200, a source electrode 211, a drain electrode 212, a first capacitor electrode 220, a second buffer layer 250, an active layer 300, a gate insulation layer 350, a first gate electrode 400, a second capacitor electrode 420, an interlayer dielectric 450, a second gate electrode 500, a first connection electrode 510, a second connection electrode 520, a planarization layer 550, and a pixel electrode 600.

The substrate 100 may be formed of a polymer material such as polyimide (PI) or the like.

The first buffer layer 150 may be formed on the substrate 100. The first buffer layer 150 may be formed in both the TFT area and the capacitor area. The first buffer layer 150 may be formed of an inorganic insulating material such as silicon nitride or the like, but is not limited thereto.

The blocking layer 200, the source electrode 211, the drain electrode 212, and the first capacitor electrode 220 may be formed on the same layer. In detail, the blocking layer 200, the source electrode 211, the drain electrode 212, and the first capacitor electrode 220 may be formed on the first buffer layer 150. The blocking layer 200, the source electrode 211, and the drain electrode 212 may be formed in the TFT area, and the first capacitor electrode 220 may be formed in the capacitor area.

The blocking layer 200 may be formed between the substrate 100 and the active layer 300 and prevents a movement of an electron in a channel area of the active layer 300, from being adversely affected by a component included in the substrate 100. Therefore, the blocking layer 200 may be formed to overlap the active layer 300. The blocking layer 200 may be formed of the same material as that of the first capacitor electrode 220, and for example, may be formed of a transparent conductive material such as indium tin oxide (ITO) or the like. However, the present embodiment is not limited thereto. For example, the blocking layer 200 may be formed of a conductive metal material. Also, the blocking layer 200 may be electrically connected to the first capacitor electrode 220, and a certain voltage may be applied from an external driving circuit unit to the blocking layer 200 and the first capacitor electrode 220.

The source electrode 211 and the drain electrode 212 may be respectively disposed at one side and the other side of the blocking layer 200 and may be formed to overlap the active layer 300. Particularly, the source electrode 211 and the drain electrode 212 may be formed to overlap a high-concentration doping area 330 of the active layer 300. Each of the source electrode 211 and the drain electrode 212 may be formed of a material which differs from that of each of the blocking layer 200 and the first capacitor electrode 220. For example, each of the source electrode 211 and the drain electrode 212 may be formed of a transparent conductive layer such as ITO or the like and a metal layer formed on the transparent conductive layer. The metal layer may be formed in a three-layer structure of MoTi, copper (Cu), and MoTi. The source electrode 211 may be electrically connected to a data line (not shown) and may receive a data signal from the data line.

The second buffer layer 250 may be formed on the blocking layer 200, the source electrode 211, the drain electrode 212, and the first capacitor electrode 220. The second buffer layer 250 may be formed in both the TFT area and the capacitor area. The second buffer layer 250 may be formed of an inorganic insulating material such as silicon nitride or the like, but is not limited thereto.

The active layer 300 may be formed on the second buffer layer 250. The active layer 300 may include a channel area 310, a plurality of low-concentration doping areas 320 which are respectively provided at one side and the other side of the channel area 310, and a plurality of high-concentration doping areas 330 which are respectively provided at one side of one of the low-concentration doping areas 320 and one side of the other of the low-concentration doping areas 320. The channel area 310 may be formed of crystalline silicon, and the low-concentration doping areas 320 and the high-concentration doping areas 330 may be formed by doping a dopant on the crystalline silicon. The low-concentration doping areas 320 may be lower in doping concentration of a dopant than the high-concentration doping areas 330.

The active layer 300 may be formed in the TFT area, and in more detail, may be formed to overlap the blocking layer 200, the source electrode 211, and the drain electrode 212. Particularly, one of the high-concentration doping areas 330 may be formed to overlap the source electrode 211, and the other of the high-concentration doping areas 330 may be formed to overlap the drain electrode 212.

The gate insulation layer 350 may be formed on the active layer 300. The gate insulation layer 350 may be formed in both the TFT area and the capacitor area.

The first gate electrode 400 and the second capacitor electrode 420 may be formed on the same layer. In detail, the first gate electrode 400 and the second capacitor electrode 420 may be formed on the gate insulation layer 350. The first gate electrode 400 and the second capacitor electrode 420 may be formed of the same material. The first gate electrode 400 may be electrically connected to the second capacitor electrode 420.

The first gate electrode 400 may be formed in the TFT area, and particularly, may be formed to overlap the channel area 310 of the active layer 300. The second capacitor electrode 420 may be formed in the capacitor area, and particularly, may be formed to laterally overlap the first capacitor electrode 220.

The interlayer dielectric 450 may be formed on the first gate electrode 400 and the second capacitor electrode 420. The interlayer dielectric 450 may be formed in both the TFT area and the capacitor area. The interlayer dielectric 450 may be formed of a hydrogen (H)-containing material. According to an embodiment of the present invention, since the interlayer dielectric 450 is formed of an H-containing material, hydrogen included in the interlayer dielectric 450 may move into the active layer 300 in a thermal treatment process, and thus, dangling bonds of the active layer 300 are reduced. Accordingly, a separate passivation layer used as a hydrogen supply source is not needed, and thus, a structure and a manufacturing process are simplified. Also, a passivation layer generally protects a source electrode and a drain electrode, but according to an embodiment of the present invention, since the source electrode 211 and the drain electrode 212 are disposed at a lower portion, a passivation layer for protecting the source electrode 211 and the drain electrode 212 is not needed.

The second gate electrode 500, the first connection electrode 510, and the second connection electrode 520 may be formed on the same layer. In detail, the second gate electrode 500, the first connection electrode 510, and the second connection electrode 520 may be formed on the interlayer dielectric 450. The second gate electrode 500, the first connection electrode 510, and the second connection electrode 520 may be formed of the same material.

The second gate electrode 500 may be formed to overlap the first gate electrode 400 in the TFT area. The second gate electrode 500 may be electrically connected to the first gate electrode 400 through a separate contact hole and thus may have a double gate structure. The double gate structure may provide the advantage that the control of the mobility of the charge carriers in the active area may be improved, which may be important e.g. in the case of using ITO as the gate material. Furthermore, using a double gate structure may allow a reduction of the width of the respective gate electrodes.

The first connection electrode 510 may extend from the TFT area to the capacitor area. Particularly, the first connection electrode 510 may be connected to, through a first contact hole CH1, the source electrode 211 and the high-concentration doping area 330 disposed at one side of the active layer 300. In the TFT area, the first connection electrode 510 may connect the source electrode 211 and the high-concentration doping area 330 disposed at the one side of the active layer 300. Also, in the capacitor area, the first connection electrode 510 may be formed to overlap the second capacitor electrode 420 and may act as a third capacitor electrode.

The second connection electrode 520 may be formed in the TFT area. Particularly, the second connection electrode 520 may be connected to, through a second contact hole CH2, the drain electrode 212 and the high-concentration doping area 330 disposed at the other side of the active layer 300. The second connection electrode 520 may connect the drain electrode 212 and the high-concentration doping area 330 disposed at the other side of the active layer 300.

Each of the first and second contact holes CH1 and CH2 may be formed by removing a partial region of each of the second buffer layer 250, the high-concentration doping areas 330 of the active layer 300, the gate insulation layer 350, and the interlayer dielectric 450.

The planarization layer 550 may be formed on the second gate electrode 500, the first connection electrode 510, and the second connection electrode 520. The planarization layer 550 may be formed in both the TFT area and the capacitor area. The planarization layer 550 may be formed of an organic polymer material such as an acryl-based polymer or the like. A third contact hole CH3 may be included in the planarization layer 550, and the second connection electrode 520 may be exposed by the third contact hole CH3.

The pixel electrode 600 may be formed on the planarization layer 550. The pixel electrode 600 may be connected to the second connection electrode 520 through the third contact hole CH3. As a result, the pixel electrode 600 may be connected to the drain electrode 212 through the second connection electrode 520.

The pixel electrode 600 may extend from the TFT area to the capacitor area. A portion of the pixel electrode 600 extending to the capacitor area may be formed to overlap the second capacitor electrode 420 and the first connection electrode 510 which acts as the third capacitor electrode.

Therefore, the portion of the pixel electrode 600 extending to the capacitor area may act as a fourth capacitor electrode.

FIGS. 4A to 4F are diagrams illustrating a process of manufacturing the TFT substrate according to an embodiment of the present invention.

Figure 4A:
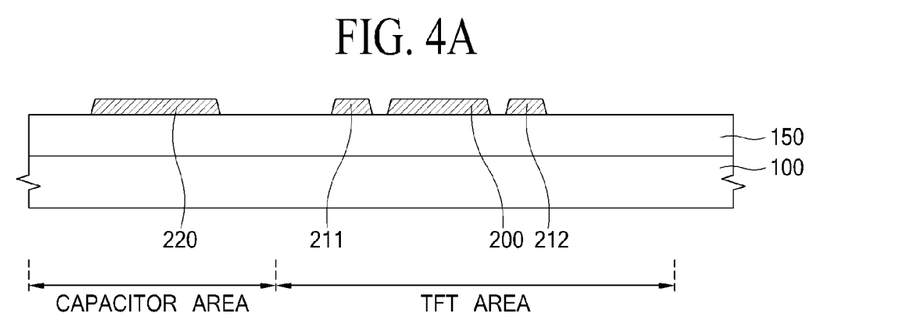
FIGS. 4A to 4F are diagrams illustrating a process of manufacturing the TFT substrate according to an embodiment of the present invention.

First, as seen in FIG. 4A, the first buffer layer 150 may be formed on the substrate 100, and the blocking layer 200, the source electrode 211, the drain electrode 212, and the first capacitor electrode 220 may be pattern-formed on the first buffer layer 150.

The first buffer layer 150 may be formed of an inorganic insulating material, such as silicon nitride or the like, all over the substrate 100 which includes the TFT area and the capacitor area.

The blocking layer 200, the source electrode 211, and the drain electrode 212 may be pattern-formed in the TFT area, and the first capacitor electrode 220 may be pattern-formed in the capacitor area.

A first mask process may be performed for pattern-forming the blocking layer 200, the source electrode 211, the drain electrode 212, and the first capacitor electrode 220.

The blocking layer 200 and the first capacitor electrode 220 may be formed of the same material. Each of the source electrode 211 and the drain electrode 212 may be obtained by providing a transparent conductive material such as ITO and stacking a metal material on the transparent conductive material. A combination of the source electrode 211 and the drain electrode 212 may be formed of a material different from that of a combination of the blocking layer 200 and the first capacitor electrode 220. In this case, the blocking layer 200, the source electrode 211, the drain electrode 212, and the first capacitor electrode 220 may be pattern-formed by a one-time mask process using a halftone mask, thereby decreasing the number of mask processes.

Figure 4B:
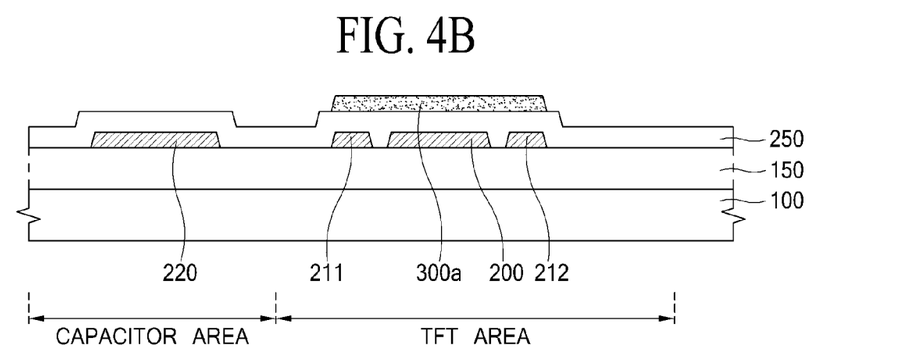

Subsequently, as seen in FIG. 4B, the second buffer layer 250 may be formed on the blocking layer 200, the source electrode 211, the drain electrode 212, and the first capacitor electrode 220, and a semiconductor layer 300a for an active layer may be pattern-formed on the second buffer layer 250.

The second buffer layer 250 may be formed of an inorganic insulating material, such as silicon nitride or the like, all over the substrate 100 which includes the TFT area and the capacitor area. In the related art, a second mask process for a second buffer layer (25 in FIG. 1) is separately needed for forming a contact hole that connects an external signal driver to a blocking layer (20 in FIG. 1) at an outer portion of a substrate. According to an embodiment of the present invention, however, in a process of FIG. 4D to be described below, the first contact hole CH1 and the second contact hole CH2 may be formed along with a contact hole that connects the external signal driver to the blocking layer 200, and thus, a separate mask process for the second buffer layer 250 is not needed.

The semiconductor layer 300a for the active layer may be pattern-formed in the TFT area. The semiconductor layer 300a for the active layer may be obtained by depositing amorphous silicon (a-Si), subsequently performing a dehydrogenation process, subsequently crystallizing the amorphous silicon with a laser, and subsequently performing a process of forming a pattern in a second mask process, but is not limited thereto.

Figure 4C:
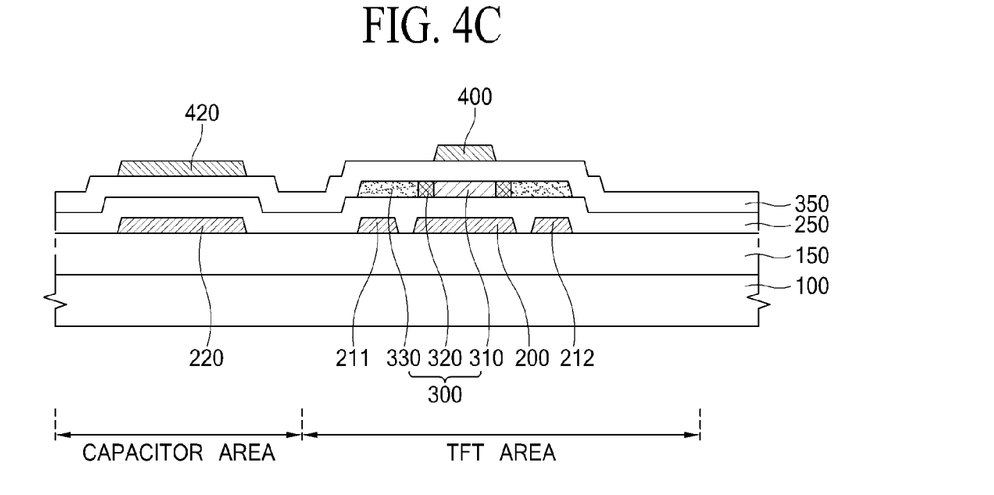

Subsequently, as seen in FIG. 4C, the gate insulation layer 350 may be formed on the semiconductor layer 300a for the active layer, the first gate electrode 400 and the second capacitor electrode 420 may be pattern-formed on the gate insulation layer 350, and the active layer 300 may be finished by doping a dopant on the semiconductor layer 300a for the active layer.

The gate insulation layer 350 may be formed of an inorganic insulating material, such as silicon nitride or the like, all over the substrate 100 which includes the TFT area and the capacitor area. Before the first gate electrode 400 is formed, a process of doping a dopant on the semiconductor layer 300a for the active layer may be additionally performed.

The first gate electrode 400 may be pattern-formed in the TFT area, and the second capacitor electrode 420 may be pattern-formed in the capacitor area. The first gate electrode 400 and the second capacitor electrode 420 may be simultaneously formed of the same material, and to this end, a third mask process may be performed.

The active layer 300 may be obtained through a process of doping a low-concentration dopant on the semiconductor layer 300a for the active layer and a process of doping a high-concentration dopant on the semiconductor layer 300a for the active layer. In detail, a low-concentration dopant may be doped on the semiconductor layer 300a for the active layer by using the first gate electrode 400 as a mask. Therefore, an area where the low-concentration dopant is not doped may become the channel area 310, and the low-concentration doping areas 320 may be respectively formed at one side and the other side of the channel area 310. Subsequently, although not shown, a photoresist pattern may be formed on the first gate insulation layer 350, and then, by using the photoresist pattern as a mask, the high-concentration doping areas 330 may be respectively formed at one side of one of the low-concentration doping areas 320 and one side of the other of the low-concentration doping areas 320. Subsequently, the photoresist pattern may be striped. Thus, the active layer 320, which includes the channel area 310, the low-concentration doping areas 320 which are respectively provided at the one side and the other side of the channel area 310, and the high-concentration doping areas 330 which are respectively provided at the one side of the one of the low-concentration doping areas 320 and the one side of the other of the low-concentration doping areas 320, may be finished. In this case, a fourth mask process may be performed for forming the photoresist pattern for forming the high-concentration doping areas 330.

Figure 4D:
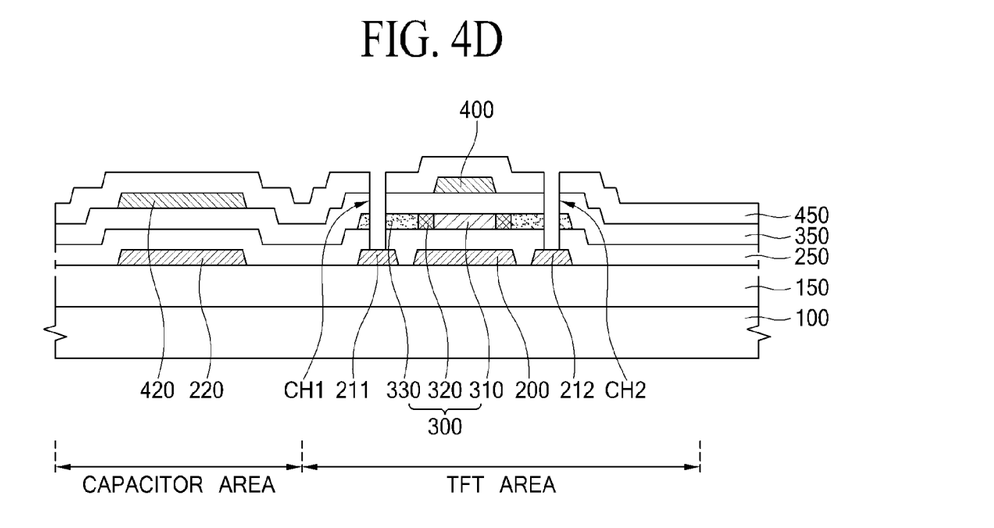

Subsequently, as seen in FIG. 4D, the interlayer dielectric 450 may be formed on the first gate electrode 400 and the second capacitor electrode 420, and then, the first contact hole CH1 and the second contact hole CH2 may be formed.

The interlayer dielectric 450 may be formed in both the TFT area and the capacitor area. Particularly, the interlayer dielectric 450 may be formed of an H-containing material, for example, SiNx. The interlayer dielectric 450 may be formed of a double layer including SiNx and $SiO_2$.

The interlayer dielectric 450 may be formed of the H-containing material, and before forming the first and second contact holes CH1 and CH2, a thermal treatment process for activation and hydrogenation may be performed at a time. Hydrogen (H) included in the interlayer dielectric 450 may be diffused to the active layer 300 by the thermal treatment process, and thus, the dangling bonds of the active layer 300 are reduced. According to an embodiment of the present invention, since the thermal treatment process for activation and hydrogenation is performed at a time, the number of thermal treatment processes is reduced compared to the related art where thermal treatment for activation and thermal treatment for hydrogenation are separately performed.

The first and second contact holes CH1 and CH2 may be simultaneously formed, and to this end, a fifth mask process may be performed. Each of the first and second contact holes CH1 and CH2 may be formed by removing a partial region of each of the second buffer layer 250, the high-concentration doping areas 330 of the active layer 300, the gate insulation layer 350, and the interlayer dielectric 450. The source electrode 211 may be exposed by the first contact hole CH1, and the drain electrode 212 may be exposed by the second contact hole CH2.

Figure 4E:
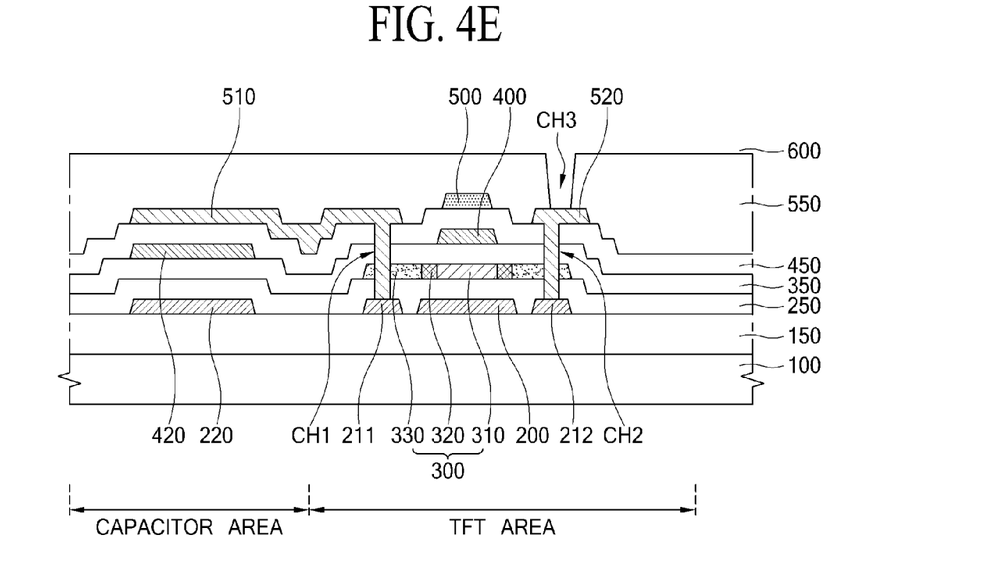

Subsequently, as seen in FIG. 4E, the second gate electrode 500, the first connection electrode 510, and the second connection electrode 520 may be pattern-formed on the interlayer dielectric 450, and then, the planarization layer 550 may be formed. Subsequently, the third contact hole CH3 may be formed in the planarization layer 550.

The second gate electrode 500, the first connection electrode 510, and the second connection electrode 520 may be simultaneously pattern-formed of the same material, and to this end, a sixth mask process may be performed.

The second gate electrode 500 may be pattern-formed in the TFT area and may be electrically connected to the first gate electrode 400 through a separate contact hole. A contact hole for an electrical connection between the second gate electrode 500 and the first gate electrode 400 may be formed simultaneously with the above-described first and second contact holes CH1 and CH2, and thus, a separate mask process for forming the contact hole is not needed.

The first connection electrode 510 may be connected to, through the first contact hole CH1, the source electrode 211 and the high-concentration doping area 330 disposed at one side of the active layer 300. Also, the first connection electrode 510 may extend to the capacitor area and act as the third capacitor electrode.

The second connection electrode 520 may be connected to, through the second contact hole CH2, the drain electrode 212 and the high-concentration doping area 330 disposed at the other side of the active layer 300.

Due to a combination of the first and second contact holes CH1 and CH2 and a combination of the first and second connection electrodes 510 and 520, the number of mask processes is reduced, and moreover, the source electrode 211 may be connected to the active layer 300, and the drain electrode 212 may be connected to the active layer 300.

The planarization layer 500 may be formed in both the TFT area and the capacitor area.

A seventh mask process may be formed for the third contact hole CH3. The third contact hole CH3 may be formed by removing a partial region of the planarization layer 550. The second connection electrode 520 may be exposed by the third contact hole CH3.

Figure 4F:
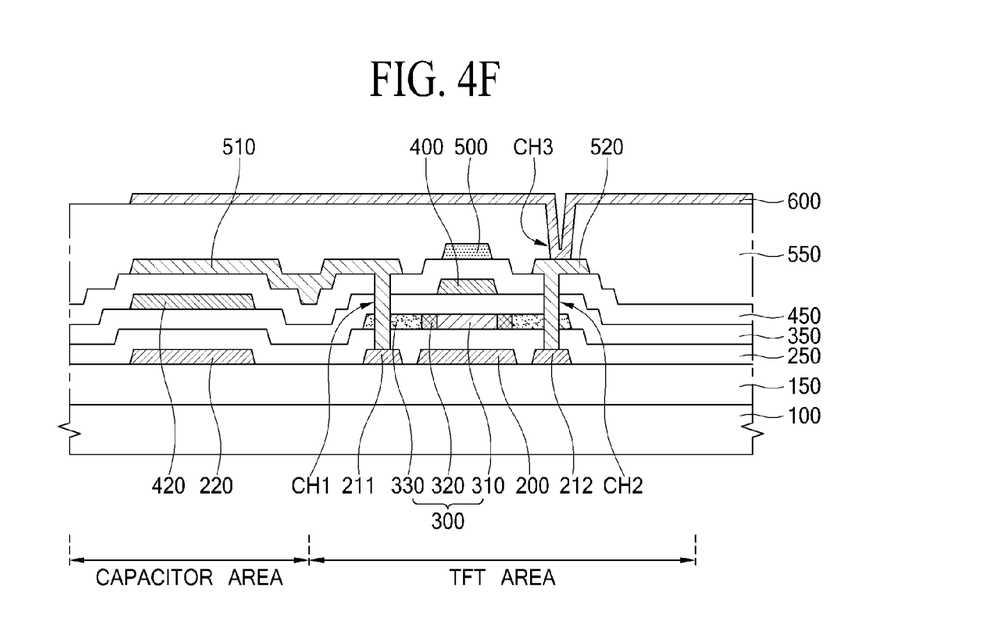

Subsequently, as seen in FIG. 4F, the pixel electrode 600 may be pattern-formed.

An eighth mask process may be performed for pattern-forming the pixel electrode 600. The pixel electrode 600 may be connected to the second connection electrode 520 through the third contact hole CH3. The pixel electrode 600 may extend to the capacitor area and act as the fourth capacitor electrode.

According to an embodiment of the present invention, three mask processes are omitted compared to the related art. Also, since the capacitor area is formed simultaneously with the TFT area, a mask process for pattern-forming the capacitor area is omitted.

Figure 5:
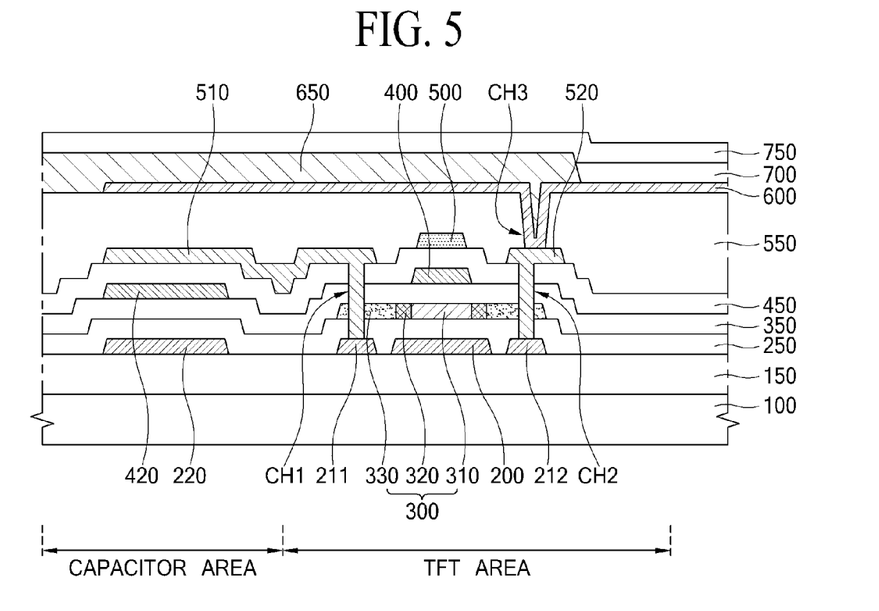
FIG. 5 is a schematic cross-sectional view of an organic light emitting display apparatus according to an embodiment of the present invention.

FIG. 5 is a schematic cross-sectional view of an organic light emitting display apparatus according to an embodiment of the present invention, and the organic light emitting display apparatus uses the above-described TFT substrate of FIG. 3.

As seen in FIG. 5, the organic light emitting display apparatus according to an embodiment of the present invention may include a substrate 100, a first buffer layer 150, a blocking layer 200, a source electrode 211, a drain electrode 212, a first capacitor electrode 220, a second buffer layer 250, an active layer 300, a gate insulation layer 350, a first gate electrode 400, a second capacitor electrode 420, an interlayer dielectric 450, a second gate electrode 500, a first connection electrode 510, a second connection electrode 520, a planarization layer 550, a pixel electrode 600, a bank layer 650, an organic layer 700, and an upper electrode 750.

The elements ranging from the substrate 100 to the pixel electrode 600 are the same as the elements of the above-described TFT substrate, and thus, their detailed descriptions are not repeated. The pixel electrode 600 may act as an anode of the organic light emitting display apparatus.

The bank layer 650 and the organic layer 700 may be formed on the pixel electrode 600. The bank layer 650 may be formed in a matrix structure to define a plurality of pixel areas, and the organic layer 700 may be formed in each of the plurality of pixel areas. The organic layer 700 may be configured by a combination of a hole injection layer, a hole transport layer, an organic emission layer, an electron transport layer, and an electron injection layer, but is not limited thereto. For example, a structure of the organic layer 700 may be changed to various structures. The upper electrode 750 may be formed on the organic layer 700. The upper electrode 750 may act as a cathode of the organic light emitting display apparatus.

Hereinabove, the organic light emitting display apparatus according to an embodiment of the present invention is illustrated and is not limited to the structure illustrated in FIG. 5. Examples of the organic light emitting display apparatus according to an embodiment of the present invention may include an organic light emitting display apparatus having various structures including the above-described TFT substrate.

Figure 6:
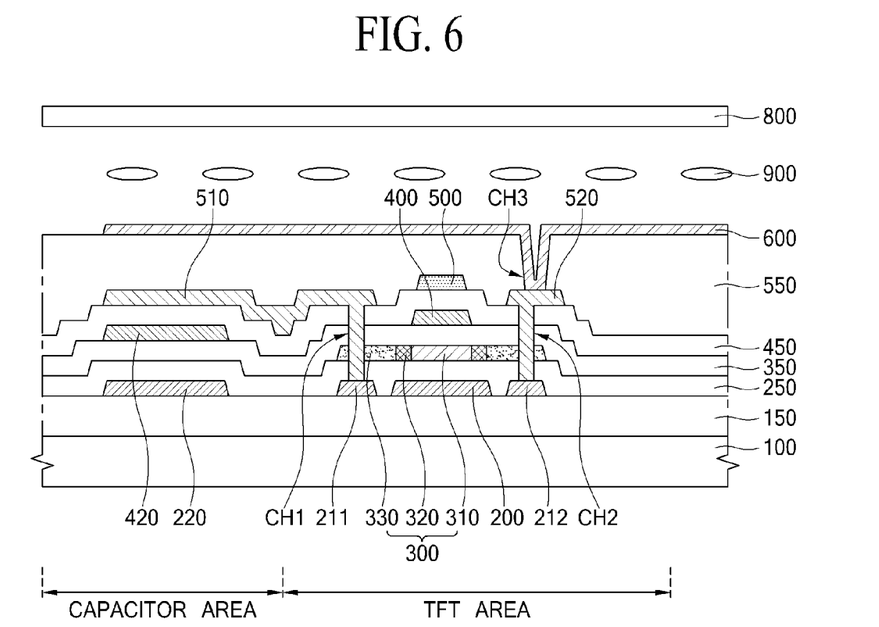
FIG. 6 is a schematic cross-sectional view of an LCD apparatus according to an embodiment of the present invention.

FIG. 6 is a schematic cross-sectional view of an LCD apparatus according to an embodiment of the present invention, and the organic light emitting display apparatus uses the above-described TFT substrate of FIG. 3.

As seen in FIG. 6, the LCD apparatus according to an embodiment of the present invention may include a TFT substrate which includes a substrate 100, a first buffer layer 150, a blocking layer 200, a source electrode 211, a drain electrode 212, a first capacitor electrode 220, a second buffer layer 250, an active layer 300, a gate insulation layer 350, a first gate electrode 400, a second capacitor electrode 420, an interlayer dielectric 450, a second gate electrode 500, a first connection electrode 510, a second connection electrode 520, a planarization layer 550, and a pixel electrode 600, an opposite substrate 800 opposite to the TFT substrate, and a liquid crystal layer 900 that is formed between the TFT substrate and the opposite substrate 800.

Although not shown in detail, the opposite substrate 800 may include a black matrix and a light shielding layer. An LCD apparatus according to an embodiment of the present invention may be modified and applied to have various modes, known to those skilled in the art, such as a twisted nematic (TN) mode, a vertical alignment (VA) mode, an in-plane switching (IPS) mode, a fringe field switching (FFS) mode, etc., and thus, a structure of the opposite substrate 800 may be variously changed. Also, the TFT substrate may further include a common electrode to drive the liquid crystal layer 900 with the pixel electrode 600.

As described above, according to the embodiments of the present invention, the number of mask processes is reduced, and thus, a process is simplified.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor substrate comprising:
    a substrate;
    a blocking layer, a source electrode, and a drain electrode disposed on a same layer over the substrate;
    an active layer disposed to overlap the blocking layer, the source electrode, and the drain electrode;
    a gate insulation layer disposed over the active layer;
    a first gate electrode disposed over the gate insulation layer;
    an interlayer dielectric disposed over the first gate electrode;
    a first connection electrode disposed over the interlayer dielectric and connected to the active layer and the source electrode through a first contact hole;
    a second connection electrode disposed over the interlayer dielectric and connected to the active layer and the drain electrode through a second contact hole;
    a planarization layer disposed over the first connection electrode and the second connection electrode; and
    a pixel electrode disposed over the planarization layer and connected to the second connection electrode through a third contact hole.

2. The thin film transistor substrate of claim 1, further comprising:
    a thin film transistor area and a capacitor area; and
    at least one capacitor formed in the capacitor area,
    wherein the blocking layer, the source electrode, and the drain electrode are formed in the thin film transistor area.

3. The thin film transistor substrate of claim 1, further comprising:
    a first buffer layer disposed over the substrate; and
    a second buffer layer disposed over the first buffer layer,
    wherein the source electrode and the drain electrode are interposed between the first buffer layer and the second buffer layer.

4. The thin film transistor substrate of claim 1,
    wherein the source electrode and the drain electrode are formed of a material which differs from the material of the blocking layer.

5. The thin film transistor substrate of claim 2,
    wherein the at least one capacitor comprises a first capacitor electrode and a second capacitor electrode, and
    wherein the second capacitor electrode and the first gate electrode are formed on a same layer.

6. The thin film transistor substrate of claim 5,
    wherein the second capacitor electrode and the first gate electrode are formed of a same material.

7. The thin film transistor substrate of claim 5,
    wherein the first capacitor electrode and the second capacitor electrode laterally overlap each other.

8. The thin film transistor substrate of claim 1, further comprising:
    a second gate electrode;

wherein the second gate electrode, the first connection electrode, and the second connection electrode are formed on a same layer, and wherein the second gate electrode, the first connection electrode, and the second connection electrode are formed on the interlayer dielectric.

9. The thin film transistor substrate of claim 1,
wherein the first connection electrode and the second connection electrode each extend through the interlayer dielectric, the gate insulation layer, and the active layer and electrically connect to the source electrode and the drain electrode, respectively.

10. The thin film transistor substrate of claim 1,
wherein the first contact hole and the second contact hole each are in direct contact with the active layer.

11. The thin film transistor substrate of claim 1,
wherein the active layer comprises a first region having two first partial regions, the first partial regions having a first doping concentration, a second region having two second partial regions, the second partial regions having a second doping concentration being smaller than the first doping concentration, and a channel region, wherein one second partial region is arranged adjacent to the channel region on one side of the channel region, and another second partial region is arranged adjacent to the channel region on an opposite side of the channel region, wherein one first partial region is arranged adjacent to one second partial region on one side, and another first partial region is arranged adjacent to the other second partial region, wherein the first connection electrode is electrically coupled with the one first partial region and with the source electrode, and wherein the second connection electrode is electrically coupled with the other first partial region and with the drain electrode.

12. The thin film transistor substrate of claim 11,
wherein one first partial region laterally overlaps the source electrode, wherein the other first partial region laterally overlaps the drain electrode, and wherein the channel region laterally overlaps the blocking layer.

13. A display apparatus, comprising:
a thin film transistor substrate; and
a further substrate arranged opposite the thin film transistor substrate,
wherein the thin film transistor substrate comprises:
a substrate;
a blocking layer, a source electrode, and a drain electrode disposed on a same layer over the substrate;
an active layer disposed to overlap the blocking layer, the source electrode, and the drain electrode;
a gate insulation layer disposed over the active layer;
a first gate electrode disposed over the gate insulation layer;
an interlayer dielectric disposed over the first gate electrode;
a first connection electrode disposed over the interlayer dielectric and connected to the active layer and the source electrode through a first contact hole;
a second connection electrode disposed over the interlayer dielectric and connected to the active layer and the drain electrode through a second contact hole;
a planarization layer disposed over the first connection electrode and the second connection electrode; and
a pixel electrode disposed over the planarization layer and connected to the second connection electrode through a third contact hole.

14. The display apparatus of claim 13, further comprising:
a liquid crystal layer formed between the thin film transistor substrate and the further substrate.

15. A display apparatus, comprising:
a thin film transistor substrate; and
an organic layer structure configured to emit light,
wherein the organic layer structure is disposed over a pixel electrode and
wherein the thin film transistor substrate comprises:
a substrate;
a blocking layer, a source electrode, and a drain electrode disposed on a same layer over the substrate;
an active layer disposed to overlap the blocking layer, the source electrode, and the drain electrode;
a gate insulation layer disposed over the active layer;
a first gate electrode disposed over the gate insulation layer;
an interlayer dielectric disposed over the first gate electrode;
a first connection electrode disposed over the interlayer dielectric and connected to the active layer and the source electrode through a first contact hole;
a second connection electrode disposed over the interlayer dielectric and connected to the active layer and the drain electrode through a second contact hole;
a planarization layer disposed over the first connection electrode and the second connection electrode; and
a pixel electrode disposed over the planarization layer and connected to the second connection electrode through a third contact hole.

* * * * *